US006384606B1

(12) United States Patent
Nussbaum

(10) Patent No.: US 6,384,606 B1
(45) **Date of Patent: *May 7, 2002**

(54) IGNITION COIL WITH LEAD FOR SECONDARY DIAGNOSTICS

(75) Inventor: Stephen H. Nussbaum, San Diego, CA (US)

(73) Assignee: SN Controls LLC, San Diego, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/519,481

(22) Filed: Mar. 6, 2000

(51) Int. Cl.[7] .......................... F02P 17/00; G01R 31/00

(52) U.S. Cl. ....................... 324/388; 324/382; 324/399; 324/502; 324/379

(58) Field of Search ................................ 324/388, 382, 324/399, 502, 379; 123/401.1, 609

(56) References Cited

U.S. PATENT DOCUMENTS

| | | | | | |
|---|---|---|---|---|---|
| 3,784,901 | A | * | 1/1974 | Miller et al. | 324/382 |
| 3,942,102 | A | * | 3/1976 | Kuhn et al. | 324/399 |
| 4,090,125 | A | * | 5/1978 | Warner | 324/399 |
| 5,054,461 | A | * | 10/1991 | Deutsch et al. | 123/609 |
| 5,068,613 | A | * | 11/1991 | Kreft et al. | 324/379 |
| 5,156,127 | A | | 10/1992 | Ghaem | |
| 5,208,540 | A | * | 5/1993 | Hoeflick | 324/388 |
| 5,216,369 | A | * | 6/1993 | Toyama | 324/388 |
| 5,411,006 | A | * | 5/1995 | Noble et al. | 123/634 |
| 5,461,315 | A | | 10/1995 | Kraus | |
| 5,623,209 | A | | 4/1997 | Lepley et al. | |
| 5,672,972 | A | * | 9/1997 | McCoy et al. | 324/393 |
| 5,896,842 | A | * | 4/1999 | Abusamra | 123/406.39 |
| 6,006,156 | A | * | 12/1999 | Tozzi | 701/114 |
| 6,133,741 | A | * | 10/2000 | Mattes et al. | 324/502 |

* cited by examiner

*Primary Examiner*—Safet Metjahic
*Assistant Examiner*—Wasseem H. Hamdan
(74) *Attorney, Agent, or Firm*—Blakely Sokoloff Taylor & Zafman LLP

(57) ABSTRACT

An ignition coil with an isolated internal lead in proximity to the secondary side can be used in a capacitive discharge ignition system with a microprocessor-based signal-processing module to monitor system performance. The diagnostic lead is fed into a diagnostic signal interface circuit that provides a logic edge to the microprocessor when the spark plug fires. By measuring the time from the firing signal provided by the microprocessor to the logic edge provided by the diagnostic signal interface circuit, the precise energy necessary to fire the plug can be determined. An ignition system that includes an ignition coil with a diagnostic lead can extend spark plug life by automatically adjusting spark energy to minimize wear on the spark plug.

3 Claims, 4 Drawing Sheets

IGNITION COIL WITH LEAD FOR SECONDARY DIAGNOSTICS

FIELD OF THE INVENTION

This invention concerns an ignition device, particularly an ignition coil with an internal diagnostic lead orthogonal to the secondary conductor, that acts as an antenna, onto which a signal is induced that possesses the exact frequency and relative time-domain characteristics as the secondary voltage.

BACKGROUND OF THE INVENTION

The most common form of ignition system employed in engine-driven field gathering applications is a capacitive discharge system, with one ignition coil and spark plug per cylinder. In these applications, the engine typically runs continuously and unattended. It is therefore important that the ignition system require as little maintenance as possible to minimize down time. The ignition system components requiring the most service or replacement are on the secondary side of the ignition coil: spark plugs, plug wires, ignitions coils, and insulating boots.

Known methods exist for monitoring the secondary side of an ignition coil. U.S. Pat. No. 5,623,209, entitled "Diagnostic System for Capacitive Discharge Ignition System" describes such a system. Unfortunately, this system only infers information about the secondary side of the ignition coil by monitoring the voltage across the storage capacitor, it does not directly monitor the secondary side. Because of this, the types of conditions this system can detect on the secondary side are limited.

A traditional method for directly monitoring the secondary side of the ignition utilizes a test lead that can be clipped around the spark plug wire. But this method is impractical in the field, as external equipment is required to gather diagnostic information. Further, at times, there may be no location onto which the test lead can be attached U.S. Pat. No. 5,461,315, entitled "High Voltage Transformer for the Continuous Monitoring of High Voltage Characteristics in a Combustion Engine," describes a system that overcomes some of the problems associated with the traditional test lead by integrating an isolated conductor within the ignition coil near the secondary. This isolated conductor forms a capacitor with the secondary high voltage conductor. Using an external capacitor, a capacitive voltage divider is formed to measure variations in voltage dependent on the high voltage of the secondary. Because this method relies on the amplitude of the voltage applied to the conductor surface relative to actual secondary voltage, this method requires precise component location and complicated interface scaling circuitry. Because this method is implemented by constructing a capacitor, it is also affected by circuit loading.

Finally, U.S. Pat. No. 5,156,127, entitled "Method for Optimizing Plug Firing Time and Providing Diagnostic Capability in an Automotive Ignition System," describes a method for determining the firing time of a spark plug. This method, however, requires an external circuit to sense the rise in current on the secondary side, while the present invention integrates an isolated lead in the ignition coil.

OBJECTS OF THE INVENTION

It is therefore an object of the present invention to provide a simple and inexpensive ignition coil with a diagnostic lead that provides a signal with the exact frequency and relative time domain characteristics as the secondary voltage.

It is a further object of this invention to provide interface circuitry that accepts the diagnostic signal as an input and provides a signal that is an indication of the precise moment of firing. This signal will be used in an ignition system to terminate a clocking signal that was started at the initiation of the firing pulse.

The precise time of the firing point is then used by the system for determining several key performance factors such as the spark plug demand voltage, the success or failure of the ignition event, and the amount of excess energy used. It is therefore a further object of the present invention to control the energy delivered to the spark plugs, thus extending their life.

The present invention deviates from previous methods that rely on predictable scaling of signal amplitude to the actual secondary amplitude by concentrating on the timing of the diagnostic signal. The amplitude of the signals generated in these other methods is used for diagnostic purposes and for continuous monitoring. In the present invention, the timing of the firing point indication is the only characteristic desired from the diagnostic signal.

It is a still further object of the present invention that the system can distinguish between the compression and exhaust strokes of a cylinder in four cycle engines without the need for an external cam reference device.

Finally, because the diagnostic leads are high impedance antennas, rather than capacitive elements, it is an object of the present invention to provide ignition coils with diagnostic leads that can be connected to form a common node, without interfering with normal engine operation. This reduces overall system cost by requiring only one signal interface circuit.

DETAILED DESCRIPTION OF THE PREFERRED EMBODIMENT

Figure 1B:
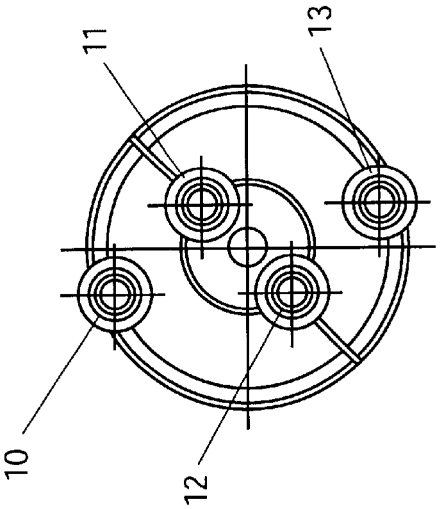
FIGS. 1A and 1B show a mechanical side view and end view, respectively, of the ignition coil according to the preferred embodiment.
Figure 1A:
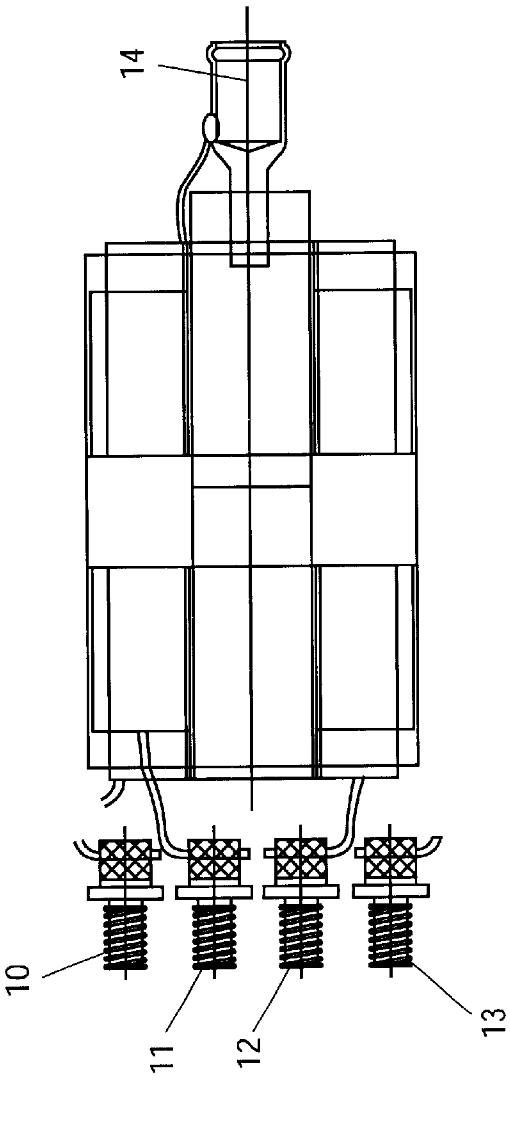

Referring to FIG. 1A, a side view of the ignition coil according to the preferred embodiment is shown. Ground Lead (G) 10, Negative Lead (−) 11, Positive Lead (+) 12, and Diagnostic Lead (S) 13 are located at one end, while the Plug Lead 14 is located at the opposite end. FIG. 1B, an end view of the ignition coil, illustrates how Leads 10–13 are arranged according to the preferred embodiment.

Figure 2:
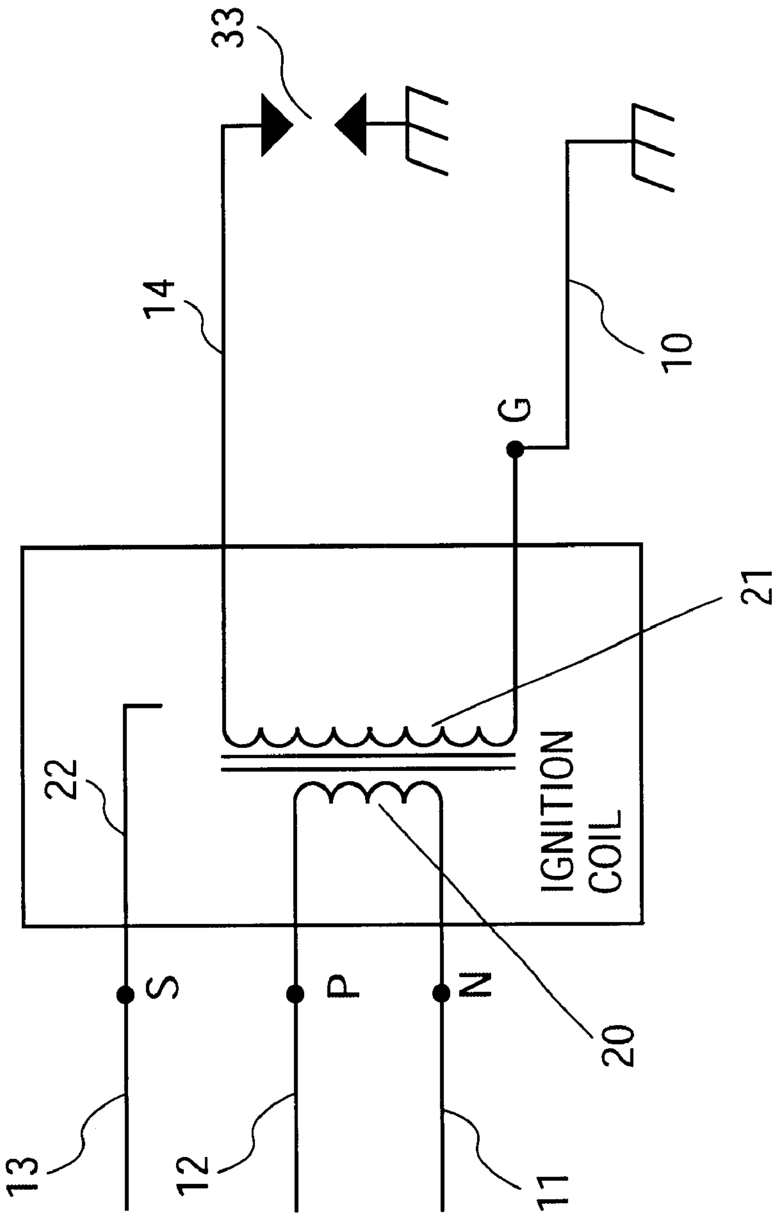
FIG. 2 shows a schematic diagram of the ignition coil according to the preferred embodiment.

FIG. 2 shows a schematic view of the ignition coil according to the preferred embodiment. Positive Lead 12, and Negative Lead 11, are connected across the Primary Side 20 of the coil, while Plug Lead 14 and Ground Lead 10 are connected across the Secondary Side 21 of the coil. Diagnostic Lead 13 is connected to Sense Wire 22.

Sense Wire 22 acts as an antenna, of sorts, sensing the electric field radiated from the Secondary Side 21. Therefore, Sense Wire 22 must be placed in close proximity to the Secondary Side 21 of the coil so that it can sense the electric field created by the high voltage across Secondary Side 21. It is critical, however, that the distance between the Sense Wire 22 and the Secondary Side 21 and the dielectric strength of the coil fill material precludes arcing between the Secondary Side 21 and the Sense Wire 22.

According to the preferred embodiment, the Sense Wire 22 is advantageously placed at an angle such that the effect of the electric field created by the voltage across the Primary Side 20 is minimized.

Figure 3:
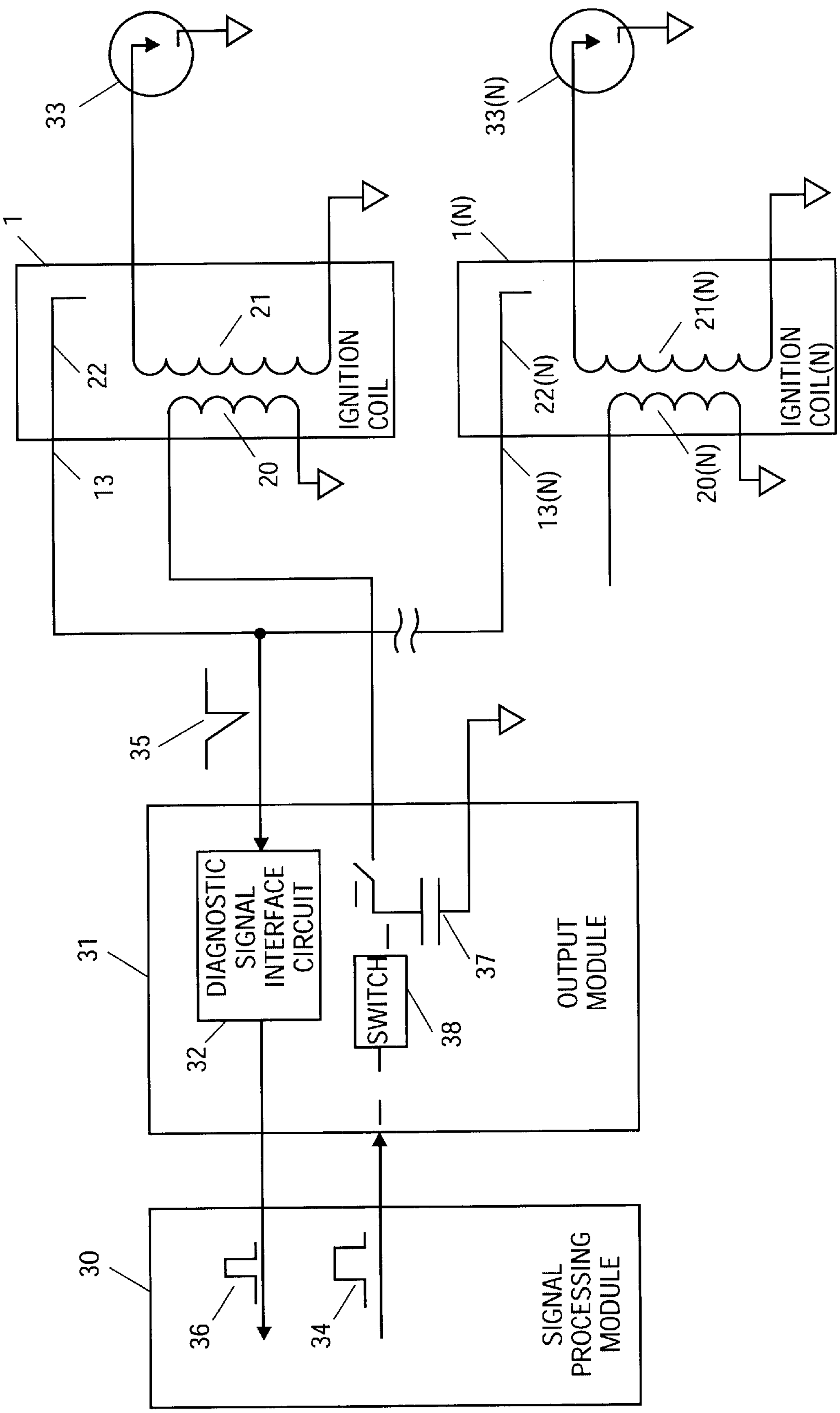
FIG. 3 shows a functional block diagram of an ignition system incorporating the present invention for secondary diagnostics.

FIG. 3 shows a functional block diagram of an ignition system utilizing Ignition Coils 1 and 1(n) of the present invention. The system consists primarily of Signal Processing Module 30, Output Module 31, and Diagnostic Signal Interface Circuit 32. The components included in this diagram are for illustrative purposes only, and it is to be understood that the exact components in the system may change while still utilizing the ignition coil of the present invention.

Signal Processing Module 30 generates Trigger Signal 34, which is sent to Switch 38 of Output Module 31, which switches tank capacitor 37, to the Primary Side 20 of ignition coil 1, of the selected cylinder. The time at which Trigger Signal 34 is generated is recorded in SPM 30. As tank capacitor 37 discharges into the primary side, the transformer action of the coil causes a voltage build up on secondary side 21. Once the voltage reaches ionization level of the spark plug gap, an arc is created, and the secondary voltage rapidly decays towards zero. This rapid decay defines the firing point. This build up and rapid decay results in the creation of diagnostic signal 35 on sense line 22.

Figure 4:
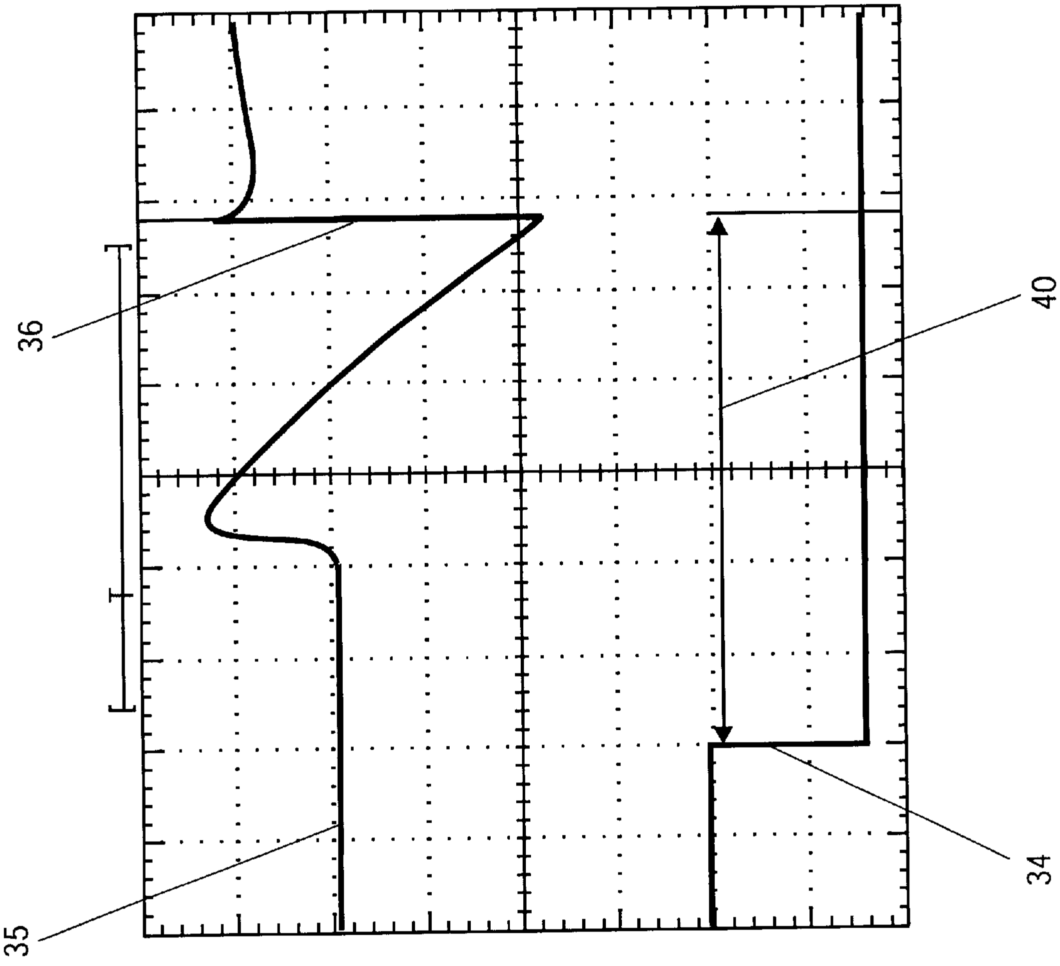
FIG. 4 shows the timing of the signal provided by the diagnostic lead of the ignition coil.

Diagnostic Signal 35 is input to Diagnostic Signal Interface Circuit 32 which detects the rapid decay at the firing point, and outputs Firing Event Signal 36 to SPM 30 coincident with the firing point. The time at which Firing Event Signal 36 is detected is recorded in SPM 30. SPM 30 then calculates the Firing Delay Time 40 from Trigger Signal 34 to Firing Event Signal 36. Firing Delay Time 40 is shown graphically in FIG. 4.

Firing Delay Time 40 can then be used in conjunction with the tank capacitor voltage prior to firing, and ignition coil constants, particular to the coils used, to determine ionization level. The ionization level is indicative of several useful diagnostic factors: the condition of Spark Plug 33, the energy required to fire Spark Plug 33, cylinder compression, etc.

If the energy required to fire the spark plugs is known, the tank capacitor voltage can be controlled to provide the minimum required energy to the spark plug, avoiding excess energy which shortens plug life.

Since only one cylinder fires at any given time, Diagnostic Leads 13 and 13(n) can be connected to form a common node without affecting the overall impedance. Therefore, only one Diagnostic Signal Interface Circuit 32 is necessary, reducing overall system cost.

I claim:

1. An ignition system comprising:

(a) a plurality of ignition coils, each ignition coil comprising:
  (i) a primary winding onto which a primary voltage is applied,
  (ii) a secondary winding onto which a secondary voltage is induced by said primary voltage, said secondary voltage creating an electric field, and
  (iii) a diagnostic lead placed in proximity to the secondary winding without being directly connected to the secondary winding, so that the electric field created by the secondary voltage induces a diagnostic signal onto the diagnostic lead;

(b) an output circuit coupled to each ignition coil to generate a trigger signal to fire a spark plug coupled to the secondary winding of the ignition coil;

(c) a diagnostic signal interface circuit coupled to the diagnostic lead of each ignition coil to receive the diagnostic signal induced on each diagnostic lead and to generate a firing event signal when each spark plug fires; and (d) a signal processing circuit to calculate an ionization time for the spark plug based on the trigger signal and the firing event signal.

2. The ignition system of claim 1 wherein the diagnostic lead of each ignition coil is internally supported within the ignition coil.

3. The ignition system of claim 1 wherein the diagnostic lead of each ignition coil is placed generally orthogonal to the secondary winding of the ignition coil.

* * * * *